United States Patent [19]

Hart

[11] Patent Number: 5,768,179

[45] Date of Patent: Jun. 16, 1998

[54] ANTIFUSE LOAD SRAM CELL

[75] Inventor: Michael J. Hart, Palo Alto, Calif.

[73] Assignee: Xilinx, Inc., San Jose, Calif.

[21] Appl. No.: 730,541

[22] Filed: Oct. 11, 1996

[51] Int. Cl.$^6$ .................................................. G11C 11/00
[52] U.S. Cl. ............................ 365/154; 257/50; 257/530
[58] Field of Search ................................ 365/154, 156, 365/96, 225.7; 257/50, 530

[56] References Cited

U.S. PATENT DOCUMENTS

| | | | |
|---|---|---|---|
| 5,418,738 | 5/1995 | Abadeer et al. | 365/100 |
| 5,426,614 | 6/1995 | Harward | 365/225.7 |
| 5,449,947 | 9/1995 | Chen et al. | 257/530 |
| 5,475,253 | 12/1995 | Look et al. | 257/530 |

*Primary Examiner*—David C. Nelms
*Assistant Examiner*—Hoai V. Ho
*Attorney, Agent, or Firm*—Jeanette S. Harms

[57] ABSTRACT

An antifuse functions as a resistive element in an SRAM cell. The antifuse layer, typically amorphous silicon, is formed to a thickness commensurate with the resistance required for proper functioning of the SRAM cell. The antifuse load SRAM cell of the present invention advantageously reduces chip area and simplifies the fabrication process. Specifically, the formation of the amorphous silicon layer is an easily controlled parameter which is therefore easily reproducible. Moreover, antifuse processing is compatible with standard CMOS processing.

4 Claims, 7 Drawing Sheets

ANTIFUSE LOAD SRAM CELL

BACKGROUND OF THE INVENTION

1. Field of the Invention

The present invention relates to an SRAM cell, and particularly to an SRAM cell including at least one antifuse as a resistive element.

2. Description of the Related Art

Static random access memory (SRAM) cells are well known in the art. FIG. 1 illustrates one known SRAM cell 100 having two access transistors 101 and 102 controlled by a wordline WL, two pull down transistors 103 and 104 having their gates coupled to nodes B and A, respectively, and two polysilicon load resistors 105 and 106 that function as pull up devices. Data are stored in SRAM cell 100 with either a logic one at node A and a logic zero at node B or vice versa.

Specifically, if a logic one signal is provided on wordline WL, then n-type transistors 101 and 102 turn on, thereby transferring the voltages on bitlines BL and $\overline{BL}$ to nodes A and B, respectively. If a logic one signal is provided on node A, then n-type transistor 104 turns on and pulls the voltage on node B to ground. The logic zero on node B fails to turn on n-type transistor 103, thereby allowing polysilicon load resistor 105 to maintain the high voltage Vcc on node A.

Although the use of polysilicon load resistors 105 and 106 in SRAM cell 100 reduces the area compared to a conventional six transistor SRAM cell, a number of disadvantages are introduced. For example, polysilicon load resistors 105 and 106 are laid out horizontally in the chip, thereby still sacrificing valuable silicon area. Moreover, fabrication of resistors 105 and 106 involves complex process steps, thereby decreasing the probability of having both stability and uniform resistivity over the life of the chip. Therefore, a need arises for a memory cell which has an area equal to or, preferably, smaller than that provided by load resistors, as well as a memory cell which simplifies the fabrication process.

SUMMARY OF THE INVENTION

In accordance with the present invention, an antifuse functions as a resistive element in an SRAM cell. The antifuse layer, typically amorphous silicon, is formed to a thickness commensurate with the resistance required for proper functioning of the SRAM cell. In one embodiment, the amorphous silicon layer is deposited to a thickness equal to or greater than 100 nanometers, thereby providing a resistance of approximately 100 Gigaohms. Because an antifuse is formed vertically, the present invention advantageously reduces chip area compared to the prior art load resistor devices which are formed horizontally. Additionally, the present invention simplifies the fabrication process compared to prior art load resistors. Specifically, the formation of the amorphous silicon layer is an easily controlled parameter which is therefore easily reproducible. Moreover, antifuse processing is compatible with standard CMOS processing.

DETAILED DESCRIPTION OF THE DRAWINGS

For the unaccessed SRAM cell to be stable, the resistive element must be the most conductive element connected to the high node (i.e. either node A or node B), thereby ensuring that the node remains high irrespective of leakages toward ground or the substrate. At the same time that sufficient current is required to balance the leakages of the cell, high resistance is required to ensure low power consumption. Thus, an optimized cell must balance these two requirements. The present invention provides such a balance.

Figure 1:
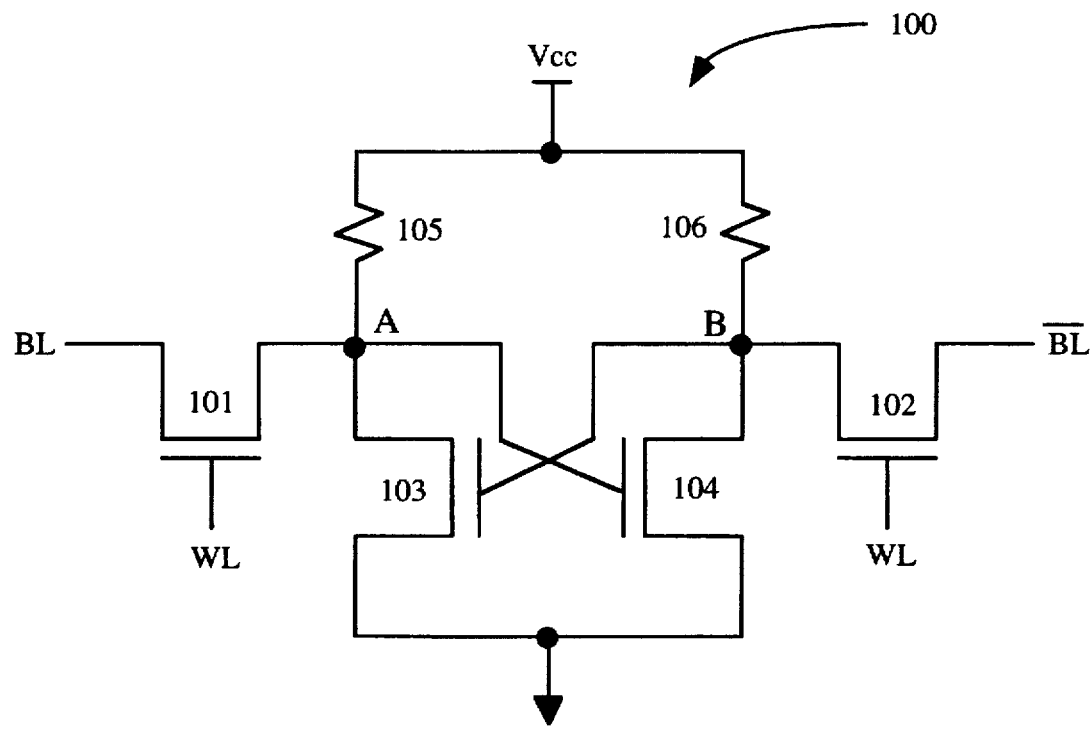
FIG. 1 shows a known four transistor SRAM cell including polysilicon load resistors.

In accordance with the present invention, an antifuse functions as the resistive element in an SRAM cell. For example in FIG. 3, which illustrates an SRAM cell 300, antifuses 305 and 306 replace load resistors 105 and 106 (FIG. 1). Transistors 301–304 are identical to transistors 101–104 (also FIG. 1). Antifuses are well known in the art of programmable logic devices. An antifuse is a structure which is non-conductive when manufactured, but becomes permanently conductive by applying a predetermined voltage across its terminals (i.e. programming the antifuse).

Figure 2:
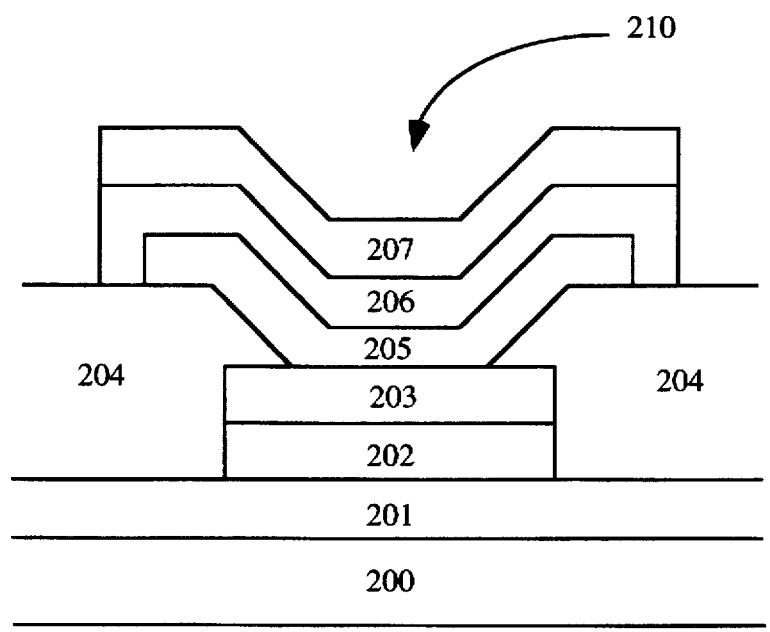
FIG. 2 illustrates a cross-section of a typical antifuse.

FIG. 2 illustrates a cross-section of a typical antifuse 210 having a substrate 200, a first insulating layer 201 formed on substrate 200, and a first condutive layer (terminal) 202 formed on first insulating layer 201. Typically, first conductive layer 202 includes aluminum. A first barrier metal layer 203 is formed and patterned on first conductive layer 202. A second insulating layer 204 is deposited and etched to form a via to barrier metal layer 203. An amorphous silicon layer 205 is formed over second insulating layer 204 and first barrier metal layer 203. As known by those skilled in the art, barrier metal layer 203 prevents the interdiffusion of the aluminum with the silicon in amorphous silicon layer 205. A second barrier metal layer 206 as well as a second condutive layer (terminal) 207 are formed on amorphous silicon layer 205.

Figure 5:
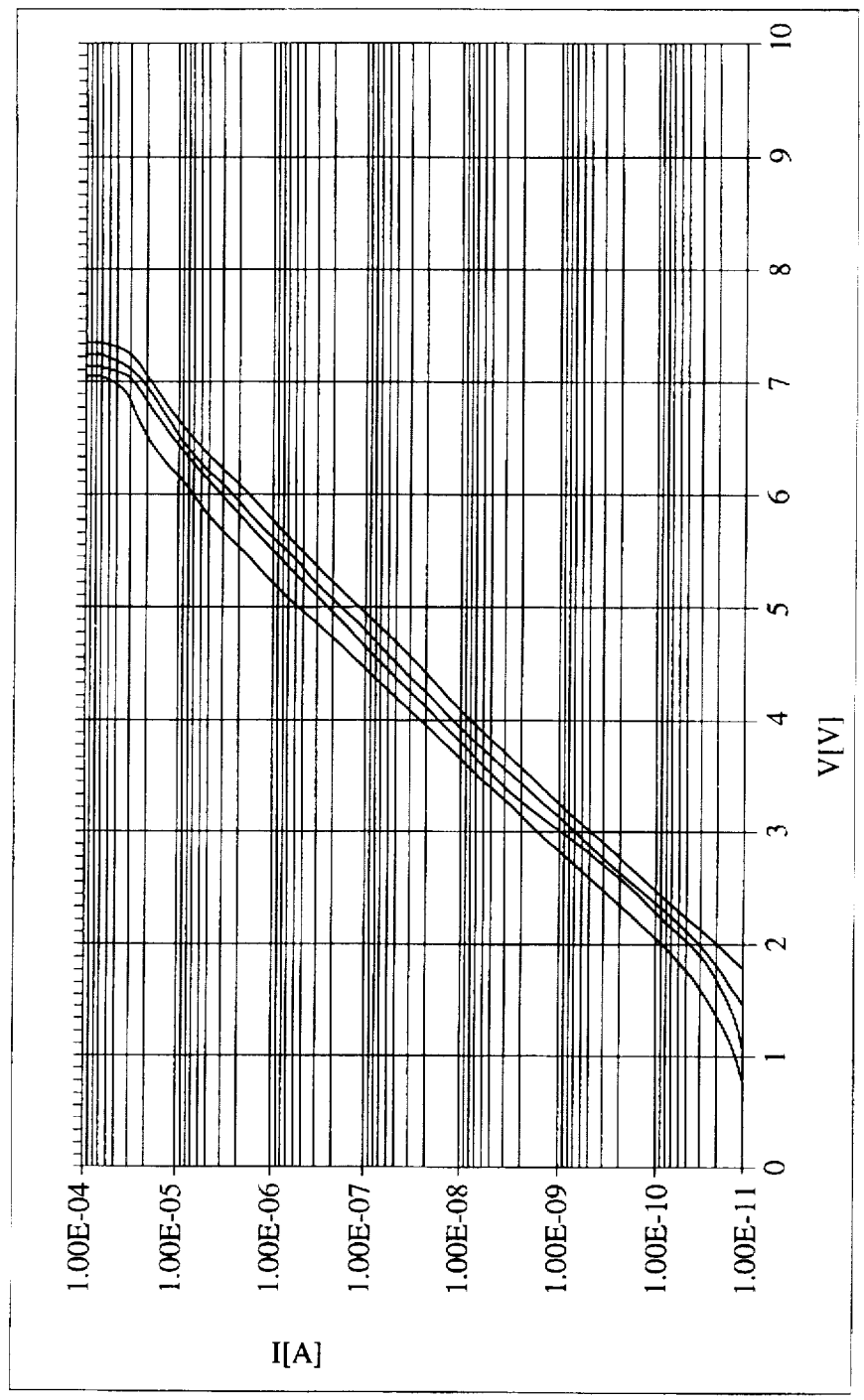
FIG. 5 illustrates a graph representing the relationship between voltage and leakage current in a conventional antifuse device.

FIG. 5 illustrates a graph representing the relationship between voltage (horizontal axis) and leakage current (vertical axis) in a conventional antifuse device. As noted in FIG. 5, at 4 volts the leakage current equals approximately 10 nA. This leakage current corresponds to a resistance (off-state) of approximately 0.4 Gigaohms. The resistance of a load element suitable for high density SRAM circuits is generally equal to or greater than 10 Gigaohms. Therefore, conventional antifuse devices may fail to provide adequate resistance for use in an SRAM cell.

In a conventional antifuse, amorphous silicon layer 205 has a thickness of approximately 45 nm. The present invention advantageously increases the thickness of the amorphous silicon layer to increase the resistance of the device.

Figure 6:
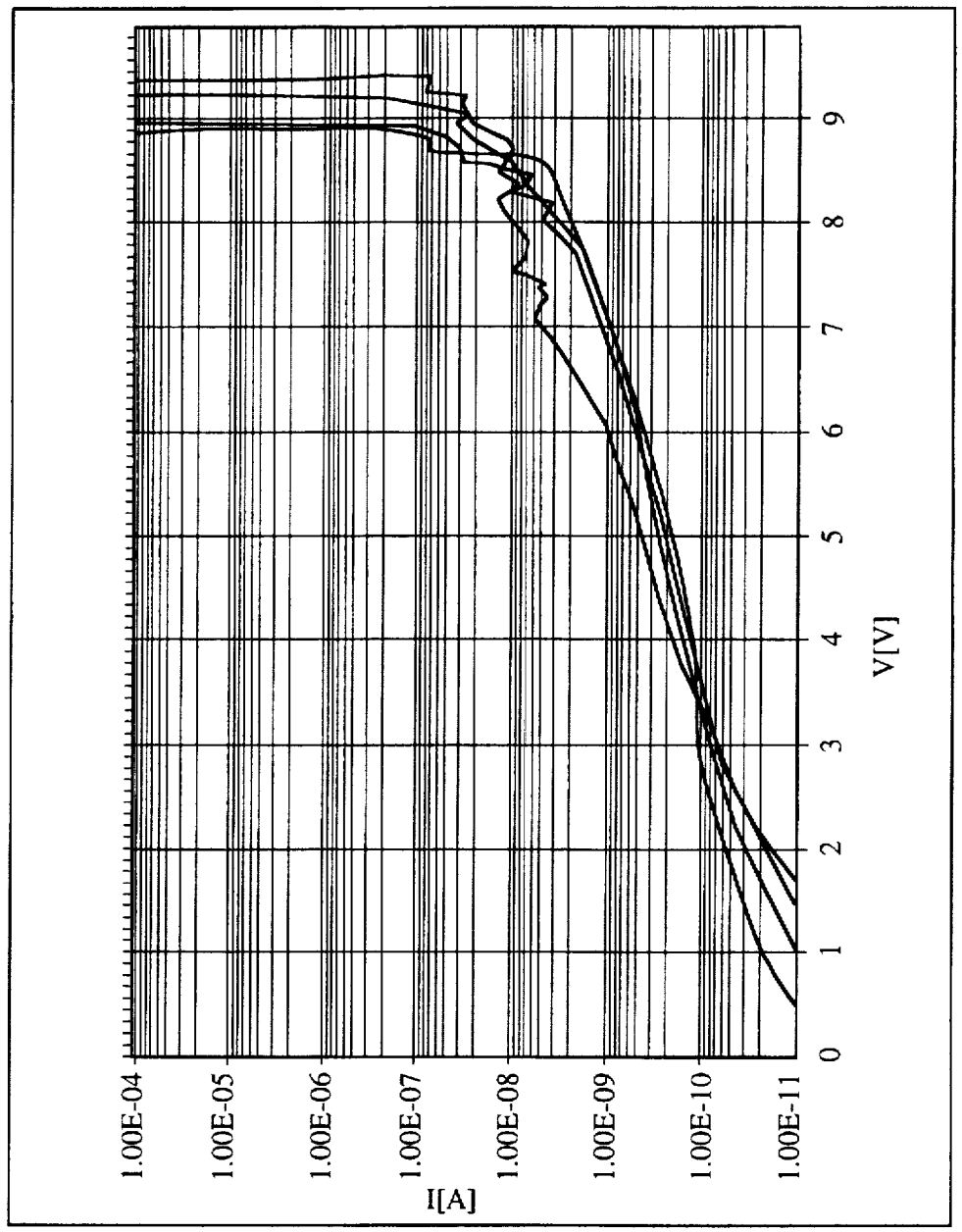
FIG. 6 illustrates a graph representing the relationship between voltage and leakage current in an antifuse device used in the present invention.

Specifically, in accordance with one embodiment of the present invention, the thickness of amorphous silicon layer 205 is increased to between approximately 70 nm and 120 nm. FIG. 6 illustrates a graph representing the relationship between voltage (horizontal axis) and leakage current (vertical axis) in an antifuse device used in the present invention having a thickness of 85 nm. As noted in FIG. 6, at 4 volts the leakage current equals approximately 0.1 nA. This leakage current corresponds to a resistance (off-state) of approximately 40 Gigaohms. Thus, an antifuse of the present invention can effectively be used as a resistive element in an SRAM cell.

Other methods of reducing leakage (and incresing resistance) can be performed in conjunction with the predetermined amorphous silicon thickness including, but not limited to, modifying the barrier treatments. In one embodiment, one such modification relates to the oxygen plasma treatment, which is described in U.S. U.S. Pat. No. 5,475,253.

The present invention advantageously reduces chip area compared to the prior art load resistor devices. Specifically, an antifuse is a vertical device, and therefore significantly reduces the required area for the memory cell compared to a polysilicon load resistor which, as mentioned previously, is a horizontal device.

Figure 3A:
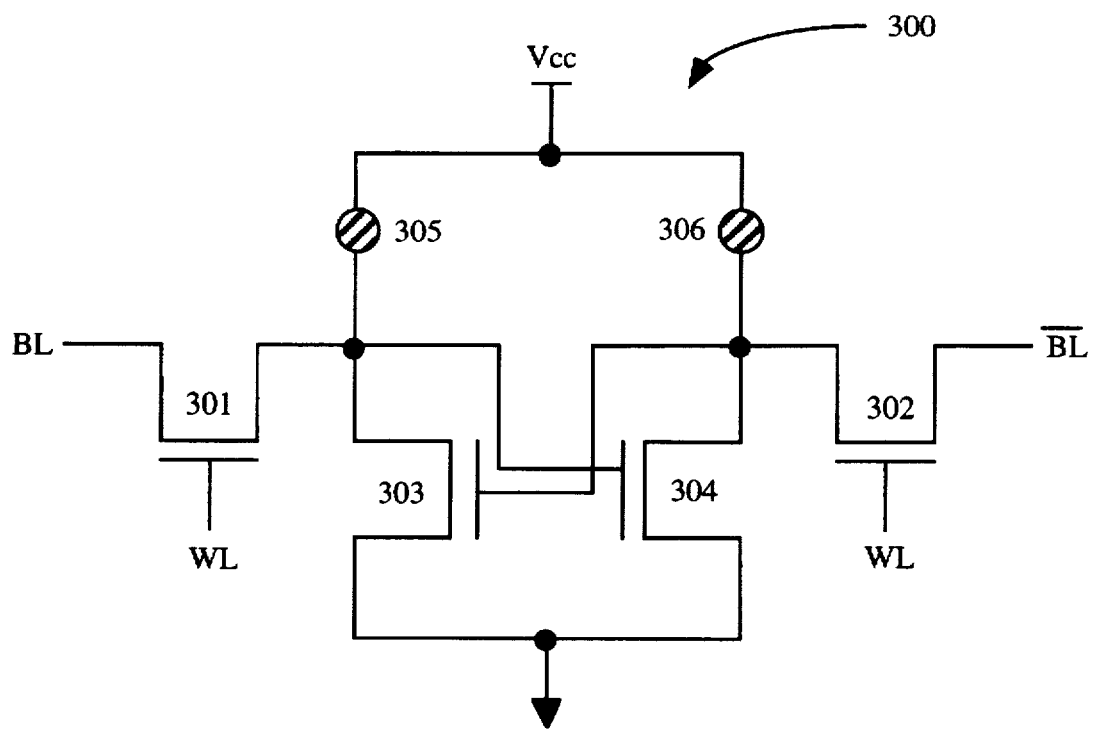
FIG. 3A shows a four transistor SRAM cell in accordance with the present invention.
Figure 3B:
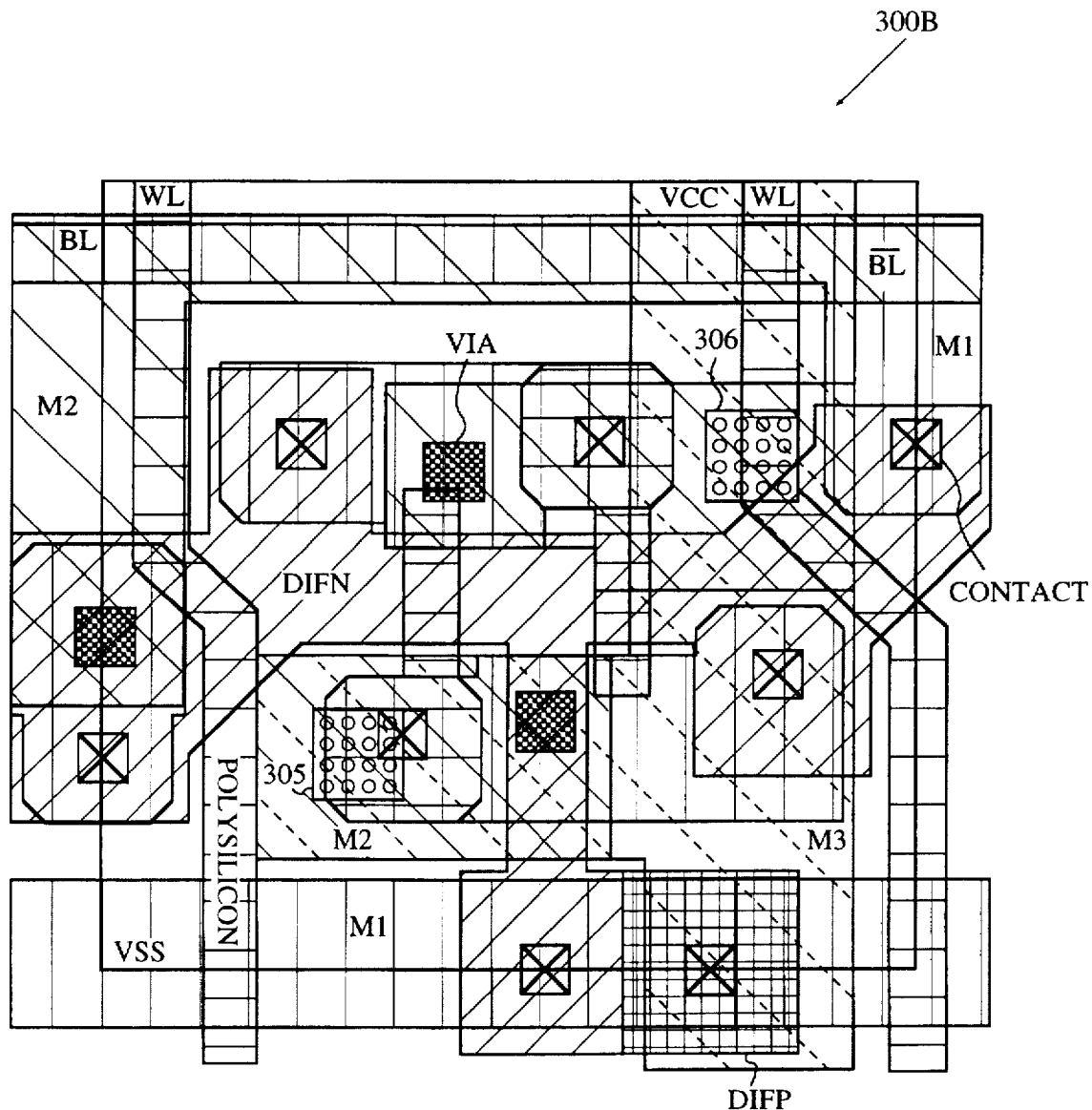
FIG. 3B illustrates a layout of the four transistor SRAM cell of FIG. 3A.

FIG. 3B illustrates one layout 300B for the four transistor SRAM cell 300 shown in FIG. 3A. FIG. 3B indicates various layers in the cell including triple metal layers M1, M2, and M3, and n- and p-type diffusion layers DIFN and DIFP. Antifuses 305 and 306 (connecting metal layers M2 and M3), as well as wordlines WL and bitlines BL and $\overline{BL}$ are labeled. In this embodiment, and assuming standard 0.6 um triple level metal antifuse design rules, a memory cell of the present invention has a cell size of 8.9×8.8 um and requires an area of 78.0 um². A typical SRAM cell 100 (FIG. 1), using the same design rules as described above, requires an area of greater than 100 um². Thus, the present invention significantly reduces the area needed for a memory cell compared to prior art memory cell 100. Moreover, the complex double polysilicon SRAM process is replaced by an easy method which includes design rules compatible with those for the standard CMOS logic processes (SPTM). As known by those skilled in the art, the cell layout is optimized in many ways and is generally designed to match product requirements.

Figure 4A:
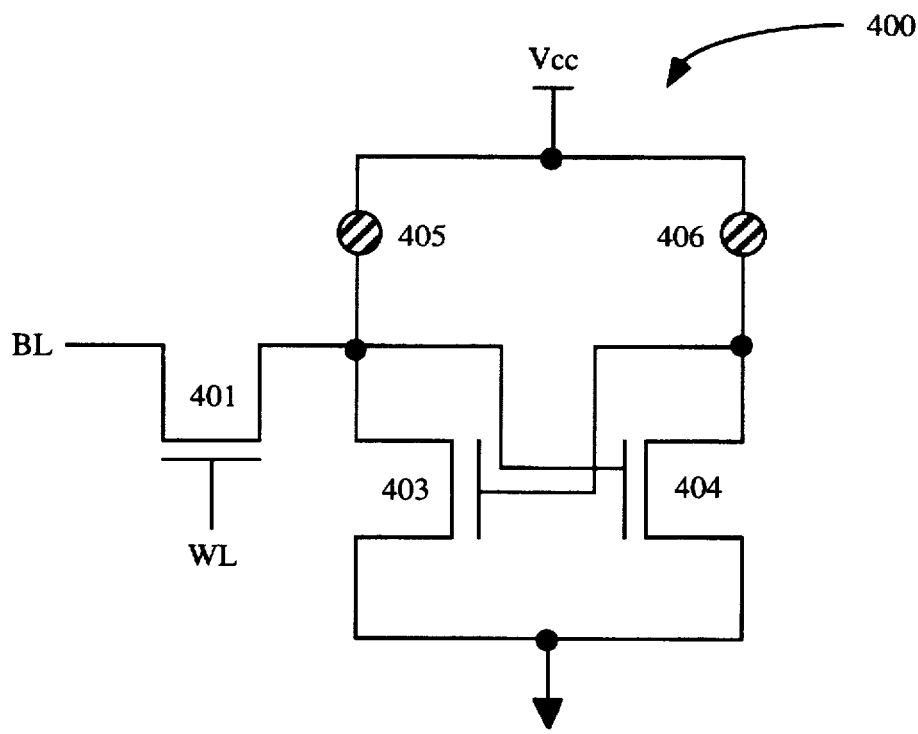
FIG. 4A illustrates a three transistor SRAM cell in accordance with the present invention.
Figure 4B:
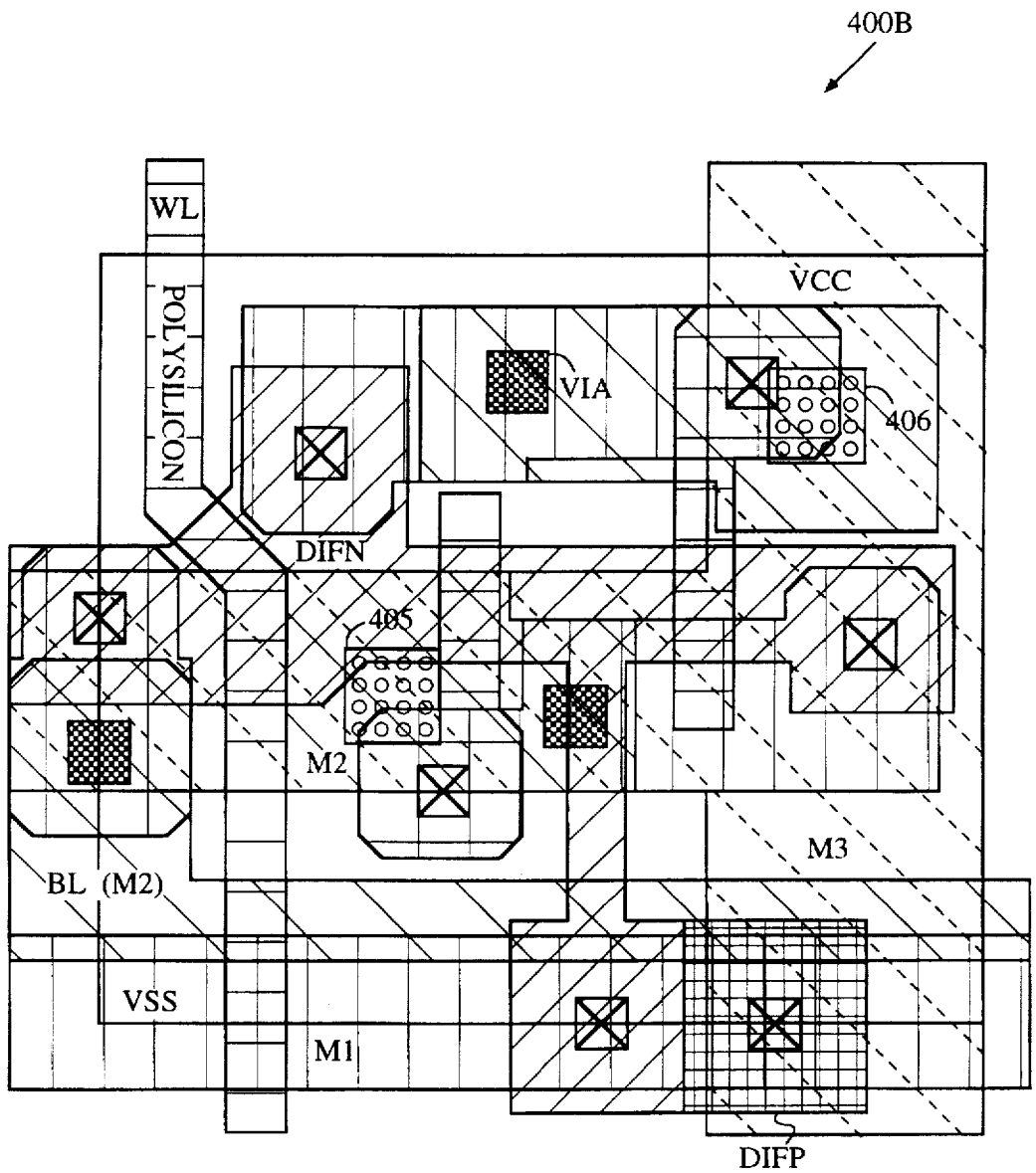
FIG. 4B shows a layout of the three transistor SRAM cell shown in FIG. 4A.
Figure 4C:
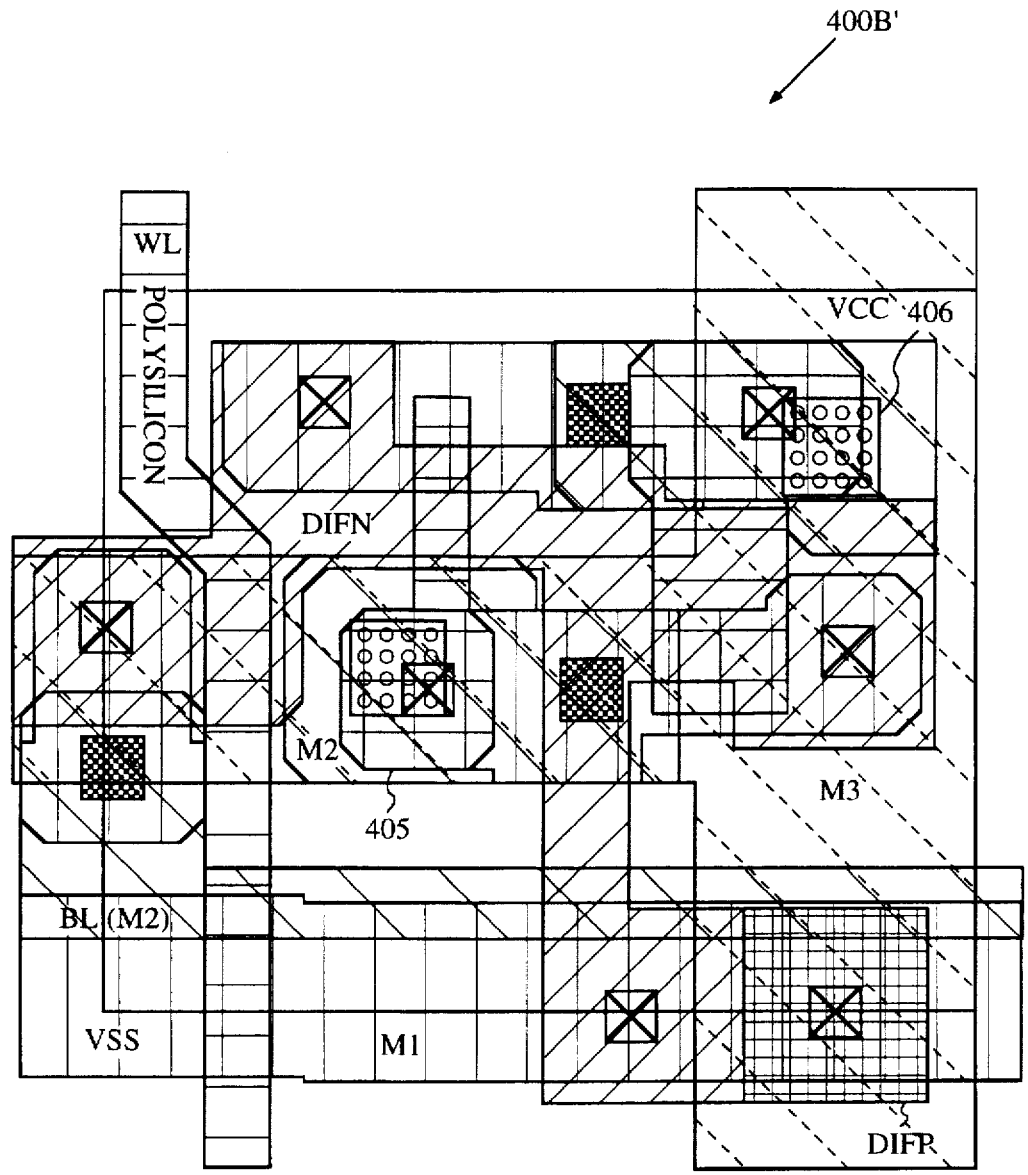
FIG. 4C illustrates another layout of the three transistor SRAM cell shown in FIG. 4A.

FIG. 4A illustrates a three transistor SRAM cell 400 in which antifuses 405 and 406 replace load resistors 105 and 106 (FIG. 1). Transistors 401, 403, and 404 are identical to transistors 101, 103, and 104 (also FIG. 1). The operation of a three transistor SRAM cell is well known in the art and therefore is not described in detail herein. FIG. 4B illustrates one layout 400B for the three transistor SRAM cell 400 shown in FIG. 4A. FIG. 4B, like FIG. 3B, indicates various layers in the cell including triple metal layers M1, M2, and M3, and n- and p-type diffusion layers DIFN and DIFP. Antifuses 305 and 306, as well as wordlines WL and bitlines BL and $\overline{BL}$ are labeled. Although sometimes more difficult to power-up into a known state, the three transistor SRAM cell of the present invention even further reduces the size of the resulting memory cell. Specifically, assuming the same design rules as described above, the three transistor SRAM cell 400 has a size of 8.9×7.6 um and requires only 67.6 um² in area. FIG. 4C illustrates another layout 400B' for the three transistor SRAM cell 400 shown in FIG. 4A. Once again assuming the above-described design rules, the three transistor SRAM cell 400 then has a size of 8.6×7.2 um and requires only 61.9 um² in area.

Finally, the present invention simplifies the fabrication process compared to prior art load resistors. Specifically, the deposition of the amorphous silicon layer is an easily controlled parameter which is therefore easily reproducible. Moreover, antifuse processing which requires the formation of a via (i.e. one additional mask) is compatible with standard CMOS processing. In contrast, the processing for the load resistors of the prior art requires a dedicated polysilicon line, additional masked implants for connecting the load resistors to other elements, and doping, all of which add complex steps to the standard CMOS process.

Although the present invention has been described in reference to an antifuse structure shown in FIG. 2, other antifuse structures are also possible. For example, other antifuse structures include those described in U.S. Pat. No. 5,475,253 and U.S. Ser. No. 08/672,185 which are incorporated by reference herein. Other embodiments will be apparent to those skilled in art in light of the specification. The present invention is defined by the claims appended hereto.

I claim:

1. A static RAM cell comprising:

a first transistor coupled between a first node and a first voltage source;

a second transistor coupled between a second node and said first voltage source, wherein the gates of said first and second transistors are coupled to said second and first nodes, respectively;

a first antifuse coupled between said first node and a second voltage source, wherein said first antifuse functions as a resistive element; and a second antifuse coupled between said second node and said second voltage source, wherein said second antifuse functions as another resistive element.

2. The static RAM cell of claim 1 further comprising a third transistor coupled to said first node.

3. The static RAM cell of claim 1 further comprising a fourth transistor coupled to said second node.

4. The static RAM cell of claim 1 wherein said antifuse has a thickness between approximately 70 nm and 120 nm.

* * * * *